United States Patent
Kim et al.

(10) Patent No.: US 10,948,630 B2
(45) Date of Patent: Mar. 16, 2021

(54) DISPLAY APPARATUS AND MANUFACTURING METHOD OF WINDOW MEMBER INCLUDED IN DISPLAY APPARATUS

(71) Applicant: Samsung Display Co., Ltd., Yongin-si (KR)

(72) Inventors: Kyungtae Kim, Asan-si (KR); Boa Kim, Icheon-si (KR); Sanghoon Kim, Hwaseong-si (KR); Hyunjoon Oh, Seongnam-si (KR); Sang-il Park, Yongin-si (KR); Heonjung Shin, Hwaseong-si (KR); Hye-jin Oh, Asan-si (KR); Jeoungsub Lee, Seoul (KR); Min-hoon Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 354 days.

(21) Appl. No.: 15/721,233

(22) Filed: Sep. 29, 2017

(65) Prior Publication Data
US 2018/0143353 A1 May 24, 2018

(30) Foreign Application Priority Data
Nov. 22, 2016 (KR) .................. 10-2016-0155978

(51) Int. Cl.
*G02B 1/14* (2015.01)
*B29D 11/00* (2006.01)
(Continued)

(52) U.S. Cl.
CPC .......... *G02B 1/14* (2015.01); *B29D 11/00278* (2013.01); *B29D 11/00326* (2013.01);
(Continued)

(58) Field of Classification Search
CPC .. G02B 1/04; G02B 1/14; G09F 9/301; B29D 11/00326; B29D 11/00278; G06F 1/1652;
(Continued)

(56) References Cited

U.S. PATENT DOCUMENTS 10,168,740 B2    1/2019   Choi et al.
2007/0046874 A1* 3/2007   Adachi ............. G02F 1/133308
                                              349/122
(Continued)

FOREIGN PATENT DOCUMENTS

CN    103998957 A    8/2014
CN    105431752 A    3/2016
(Continued)

OTHER PUBLICATIONS

Chinese Office Action dated Nov. 24, 2020, issued in corresponding Chinese Patent Application No. 201711096544.2 (8 pages).

*Primary Examiner* — Eli D. Strah
(74) *Attorney, Agent, or Firm* — Lewis Roca Rothgerber Christie LLP

(57) ABSTRACT

A display apparatus includes a display module having a display surface configured to display an image, and a window member disposed on the display surface. The window member includes a flexible base layer having a plurality of concave patterns defined on an upper portion thereof, and a plurality of hard coating patterns each disposed in a respective one of the concave patterns and having a hardness greater than the hardness of the flexible base layer.

9 Claims, 19 Drawing Sheets

(51) Int. Cl.
*G06F 1/16* (2006.01)
*G09F 9/30* (2006.01)
*G02B 1/04* (2006.01)
*H05K 5/00* (2006.01)
*H05K 5/03* (2006.01)
*B29C 45/14* (2006.01)
*B29C 37/00* (2006.01)
*G02F 1/1333* (2006.01)

(52) U.S. Cl.
CPC ............ *G02B 1/04* (2013.01); *G06F 1/1652* (2013.01); *G09F 9/301* (2013.01); *H05K 5/0017* (2013.01); *H05K 5/03* (2013.01); *B29C 37/0028* (2013.01); *B29C 2045/14868* (2013.01); *B32B 2307/536* (2013.01); *B32B 2307/546* (2013.01); *B32B 2457/20* (2013.01); *B32B 2457/208* (2013.01); *G02F 1/133305* (2013.01); *G02F 2001/133311* (2013.01); *G02F 2001/133331* (2013.01); *G02F 2201/50* (2013.01); *G02F 2202/022* (2013.01)

(58) Field of Classification Search
CPC .. H05K 5/03; H05K 5/0017; B32B 2307/536; B32B 2307/546; B32B 2457/20; B32B 2457/208; G02F 2201/50; G02F 2001/133331; G02F 2001/133311; G02F 2202/022; G02F 1/133305; B29C 37/0028; B29C 2045/14868
See application file for complete search history.

(56) References Cited

U.S. PATENT DOCUMENTS

| | | | |
|---|---|---|---|
| 2015/0109546 A1* | 4/2015 | Tai | G02B 6/0055 349/12 |
| 2015/0212547 A1* | 7/2015 | Park | G06F 1/1652 349/12 |
| 2016/0014881 A1* | 1/2016 | Shin | G06F 1/1652 361/749 |
| 2016/0271914 A1* | 9/2016 | Xie | H01L 27/323 |
| 2016/0320803 A1* | 11/2016 | Oh | B32B 27/08 |

FOREIGN PATENT DOCUMENTS

| | | | |
|---|---|---|---|
| CN | 105843437 A | | 8/2016 |
| JP | 2001-141908 A | * | 5/2001 |
| JP | 2013-88635 A | | 5/2013 |
| KR | 10-2015-0036981 A | | 4/2015 |
| KR | 10-2016-0006585 A | | 1/2016 |
| KR | 10-2016-0094586 A | | 8/2016 |
| KR | 10-2016-0094587 A | | 8/2016 |

\* cited by examiner

DISPLAY APPARATUS AND MANUFACTURING METHOD OF WINDOW MEMBER INCLUDED IN DISPLAY APPARATUS

CROSS-REFERENCE TO RELATED APPLICATION

This patent application claims priority to and the benefit of Korean Patent Application No. 10-2016-0155978, filed on Nov. 22, 2016, the entire contents of which are hereby incorporated by reference.

FIELD

The present disclosure herein relates to a display apparatus and a manufacturing method of a window member, and for example, to a display apparatus which has the flexibility and improved scratch resistance at the same time, and a manufacturing method of a window member.

BACKGROUND

Generally, in a display apparatus, glass is used as a window member for protecting a display panel. In addition, tempered glass is used as a window member for protecting the surface of a display apparatus of a mobile terminal such as a smart phone, a table personal computer (PC), and the like. However, there are disadvantages in that glass and tempered glass may break by an external impact and it is difficult to apply glass and tempered glass to a flexible display. Accordingly, a study for implementing a window member by using a plastic material has been steadily in progress.

Plastic has been applied as an alternative material for glass because plastic is lightweight, shock-resistant, transparent, and the like. A trend of composing a window member by using a plastic material, which is excellent in properties such as weather resistance, scratch resistance for enduring scratches by an external stimulus, shock resistance to an external impact, and machinability, is gradually increasing. A window member composed of plastic may make a display apparatus slim and improve the flexibility of a display apparatus such that a flexible display may be implemented.

SUMMARY

Embodiments of the present disclosure provide a display apparatus having improved scratch resistance while maintaining the flexibility thereof.

Embodiments of the present disclosure also provide a window member included in a display apparatus having improved flexibility and scratch resistance.

An embodiment of the present disclosure provides a display apparatus including a display module having a display surface configured to display an image, and a window member disposed on the display surface. The window member includes a flexible base layer having a plurality of concave patterns defined on an upper portion thereof, and a plurality of hard coating patterns each disposed in a respective one of the concave patterns and having a greater hardness than the hardness of the flexible base layer.

In an embodiment, each of the concave patterns may have a set (e.g., predetermined) depth in the thickness direction of the flexible base layer, and each of the hard coating patterns may have a height identical to (e.g., substantially identical to) the depth of each corresponding concave pattern.

In an embodiment, each of the hard coating patterns may fill a respective space defined by respective ones of the concave patterns.

In an embodiment, the flexible base layer and the hard coating patterns may define an upper surface of the window member, wherein the upper surface may be a substantially flat plane.

In an embodiment, the upper surface may be divided into a first area in which the window member is bent or spread and a second area that is adjacent to the first area, and a portion of the first area having the hard coating patterns defined thereon may be smaller than a portion of the second area having the hard coating patterns defined thereon when viewed in a plane.

In an embodiment, the display module may be bent or spread about a bending axis extending in one direction, and each of the plurality of hard coating patterns may be extended in a direction parallel (e.g., substantially parallel) to the bending axis.

In an embodiment, the display module may be bent or spread along a first bending axis extending in one direction, and may be bent or spread along a second bending axis extending in a direction crossing the one direction. The plurality of hard coating patterns may be arranged in a matrix form by being spaced apart in a direction parallel (e.g., substantially parallel) to the first bending axis and the second bending axis respectively.

In an embodiment, each of the plurality of hard coating patterns may be of a semicircular, a triangular, or a rectangular shape when viewed in a cross section.

In an embodiment, the difference in refractive index between the flexible base layer and the hard coating patterns may be from 0 to about 0.2.

In an embodiment, the flexible base layer may include polyurethane or polycarbonate, and the hard coating patterns may include an acrylate-based compound or an epoxy-based compound.

In an embodiment of the present disclosure, a manufacturing method of a window member includes preparing a flexible base layer, forming a plurality of concave patterns on an upper portion of the flexible base layer, and forming a plurality of hard coating patterns in respective ones of the concave patterns.

In an embodiment, forming the concave patterns may be performed by means of an etching process.

In an embodiment, forming the hard coating patterns may include filling each of the concave patterns with a hard coating material, and curing the hard coating material.

In an embodiment, a plurality of first functional groups may be formed on the surfaces of the concave patterns when forming the concave patterns, and a second functional group included in the hard coating material may be chemically combined with the first functional group (e.g., may chemically react with the first functional group to form a chemical bond) when filling with the hard coating material.

In an embodiment, the first functional group and the second functional group may be at least one selected from a hydroxyl group (—OH), a carboxyl group (—COOH), or an isocyanate group (—NCO).

In an embodiment of the present disclosure, a manufacturing method of a window member includes forming a plurality of hard coating patterns on a carrier substrate, forming a flexible base layer to cover the hard coating patterns entirely (e.g., substantially entirely), and removing the carrier substrate.

In an embodiment, forming the hard coating patterns may include applying a hard coating material such that the hard coating patterns are extended in one direction and spaced apart in a direction crossing the one direction, and curing the hard coating material.

In an embodiment, forming the flexible base layer may include applying a base material to cover the hard coating patterns and to fill the spaces spaced apart among the hard coating patterns, and curing the base material.

In an embodiment, a first functional group included in the surfaces of the hard coating patterns and a second functional group included in the base material may be chemically combined (e.g., the second functional group may chemically react with the first functional group to form a chemical bond) when applying the base material.

In an embodiment, the first functional group and the second functional group may be at least one from a hydroxyl group (—OH), a carboxyl group (—COOH), or an isocyanate group (—NCO).

BRIEF DESCRIPTION OF THE FIGURES

The accompanying drawings are included to provide a further understanding of embodiments of the present disclosure, and are incorporated in and constitute a part of this specification. The drawings illustrate exemplary embodiments of the present disclosure and, together with the description, serve to explain principles of embodiments of the present disclosure. In the drawings.

DETAILED DESCRIPTION

Figure 1A:
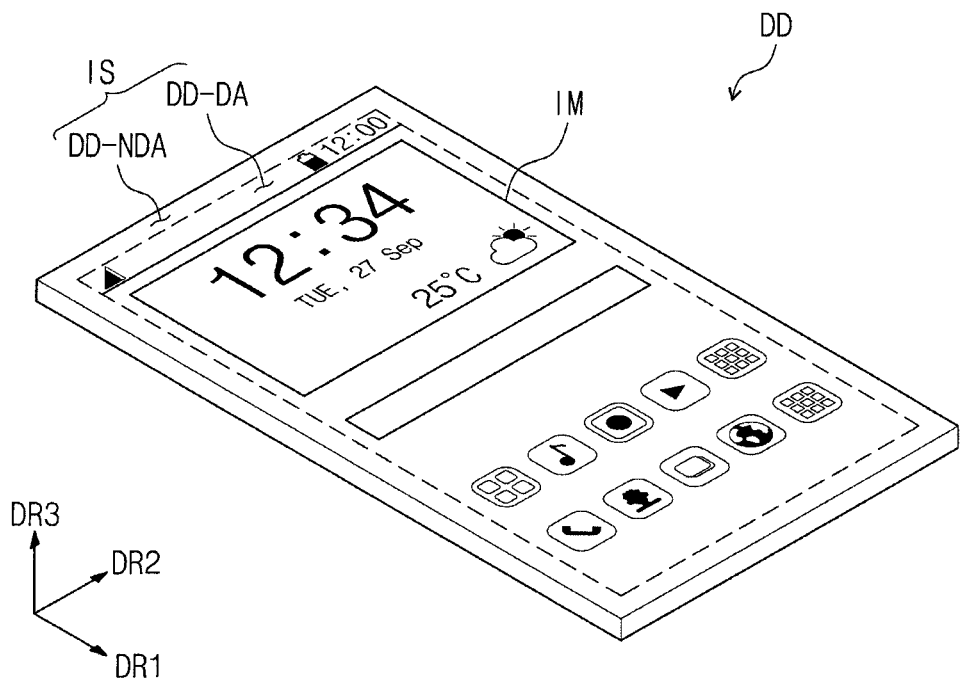
FIG. 1A is a perspective view of a display apparatus according to an embodiment of the present disclosure.

Exemplary embodiments of the present disclosure will be described below in more detail with reference to the accompanying drawings. The subject matter of the present disclosure may, however, be embodied in different forms and should not be construed as limited to the embodiments set forth herein. Rather, these embodiments are provided so that this disclosure will be thorough and complete, and will fully convey the scope of the subject matter of the present disclosure to those skilled in the art.

In the present disclosure, when an element (or a region, a layer, a section, etc.) is referred to as being "on," "connected to," or "coupled to" another element, it may be directly on, connected to, or coupled to the other element or intervening elements or layers may be present.

Like reference numerals denote like elements. Also, in the accompanying drawings, thicknesses, ratios, and sizes of elements may be exaggerated for clarity and descriptive purposes. The term "and/or," includes any and all combinations of one or more of the associated listed items.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present disclosure. The terms of a singular form may include plural forms unless the context clearly indicates otherwise.

In addition, terms, such as "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings.

It should be understood that the terms "include" or "have," when used in this specification, specify the presence of stated features, integers, steps, operations, elements, components, and/or groups thereof, but do not preclude the presence or addition of one or more other features, integers, steps, operations, elements, components, and/or groups thereof.

Hereinafter, a display apparatus according to an embodiment of the present disclosure will be described.

Figure 1B:
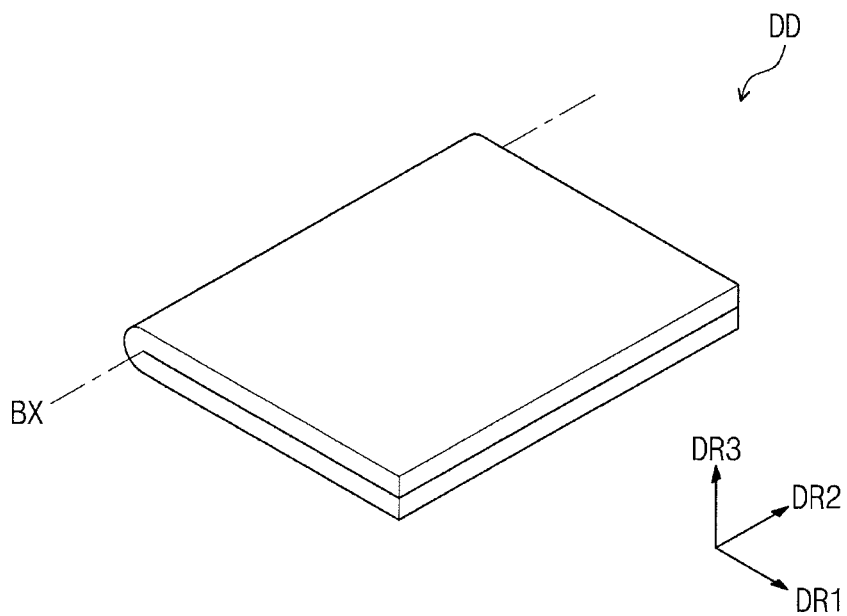
FIGS. 1B-1C are perspective views showing the display apparatus illustrated in FIG. 1A in a folded state.
Figure 1C:
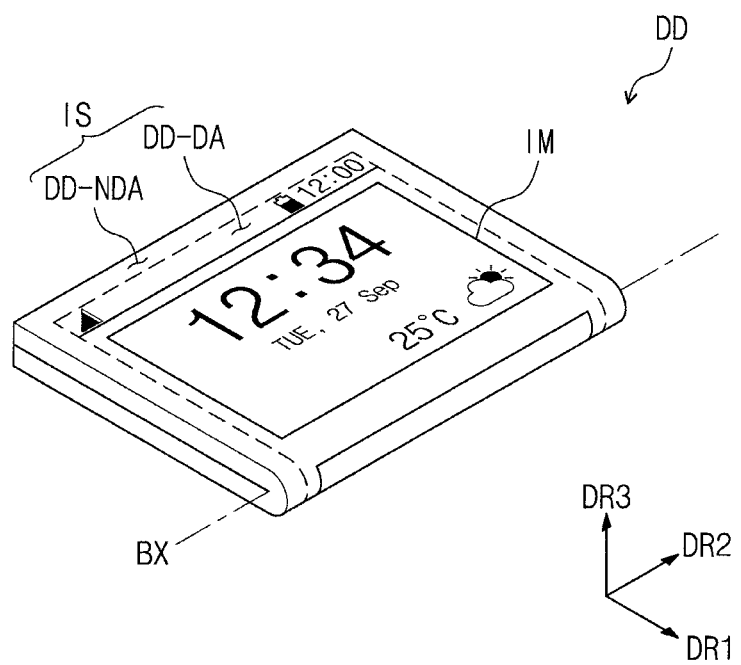

FIG. 1A is a perspective view of a display apparatus according to an embodiment of the present disclosure. FIGS. 1B-1C are each showing the display apparatus illustrated in FIG. 1A in a folded state. Hereinafter, referring to FIGS. 1A-1C, a display apparatus DD according to an embodiment of the present disclosure will be explained.

Referring to FIG. 1A, a display surface IS on which an image IM is displayed is parallel (e.g., substantially parallel) to a surface defined by a first direction DR1 and a second direction DR2. A normal direction of the display surface IS, that is a thickness direction of the display apparatus DD, is indicated by a third direction DR3. A front surface (or an upper surface) and a rear surface (or a lower surface) of each member are divided by the third direction DR3. However, a direction indicated by the first to third directions DR1 to DR3 is a relative concept, and may be changed into a different direction. Hereinafter, a first to third directions are directions which the first to third directions DR1 to DR3 respectively indicate, and are assigned the same or substantially the same reference numerals. In this embodiment, a flexible display apparatus is illustrated, but the subject matter of the present disclosure is not limited thereto.

Referring to FIG. 1A, the display surface IS of the display apparatus DD according to an embodiment of the present disclosure may include a plurality of areas. The display apparatus DD includes a display area DD-DA on which the image IM is displayed, and a non-display area DD-NDA that is adjacent to the display area DD-DA. The non-display area DD-NDA is an area on which an image is not displayed. In FIG. 1, application icons and a clock window are illustrated as an example of the image IM. The display area DD-DA may be of a square shape. The non-display area DD-NDA may surround the display area DD-DA, but is not limited thereto. A shape of the display area DD-DA and a shape of the non-display area DD-NDA may be designed relatively to each other.

The display apparatus DD may include a housing. The housing is disposed on the outside of the display apparatus DD, and may accommodate components inside.

Referring to FIG. 1B, the display apparatus DD according to an embodiment of the present disclosure may be folded in with respect to a bending axis BX. Referring to FIG. 1C, the display apparatus DD according to an embodiment of the present disclosure may be folded out with respect to the basis of the bending axis BX. Folding methods of the display apparatus DD are exemplary illustrated in FIGS. 1B-1C, but are not limited thereto.

The display apparatus DD according to an embodiment of the present disclosure may be a foldable display apparatus or a rollable display apparatus which can be rolled, but is not limited thereto. The display apparatus DD according to an embodiment of the present disclosure may be a stretchable display apparatus. The display apparatus DD according to an embodiment of the present disclosure may be used for large electronic devices, such as a TV set, a monitor, and the like, or for small and medium electronic devices, such as a cellphone, a tablet, a global positioning system (GPS), a game console, a smart watch, and the like.

Figure 2A:
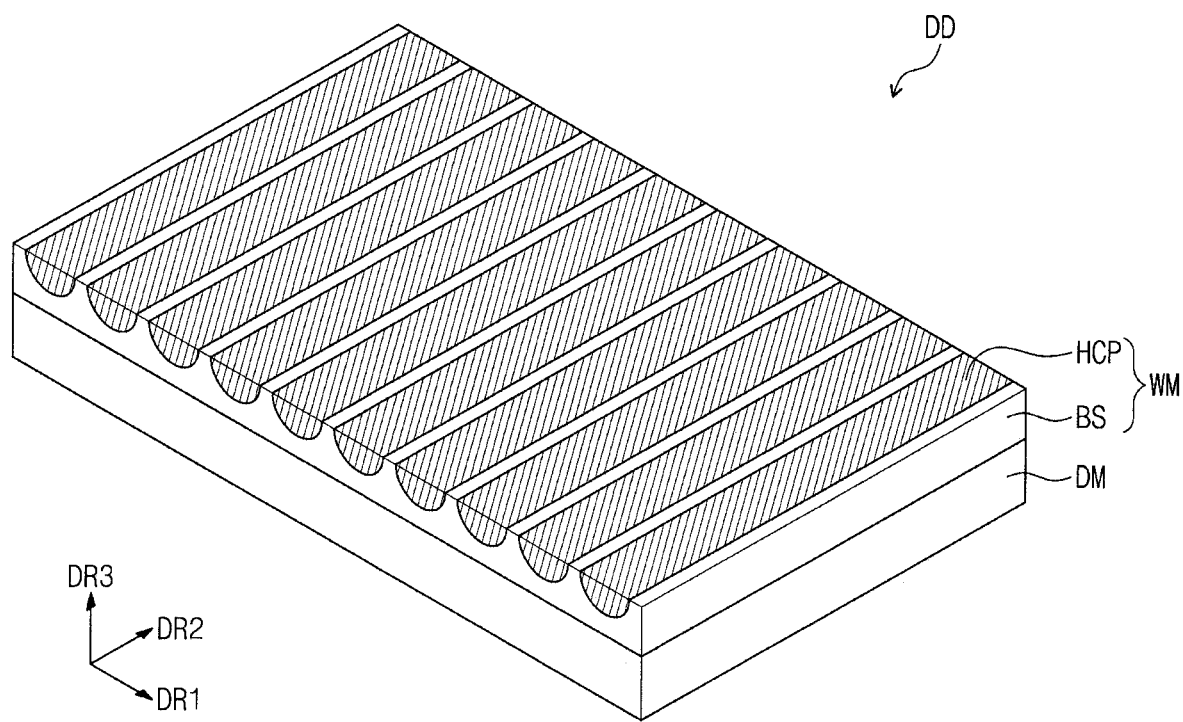
FIG. 2A is a combined perspective view of a display apparatus according to an embodiment of the present disclosure.
Figure 2B:
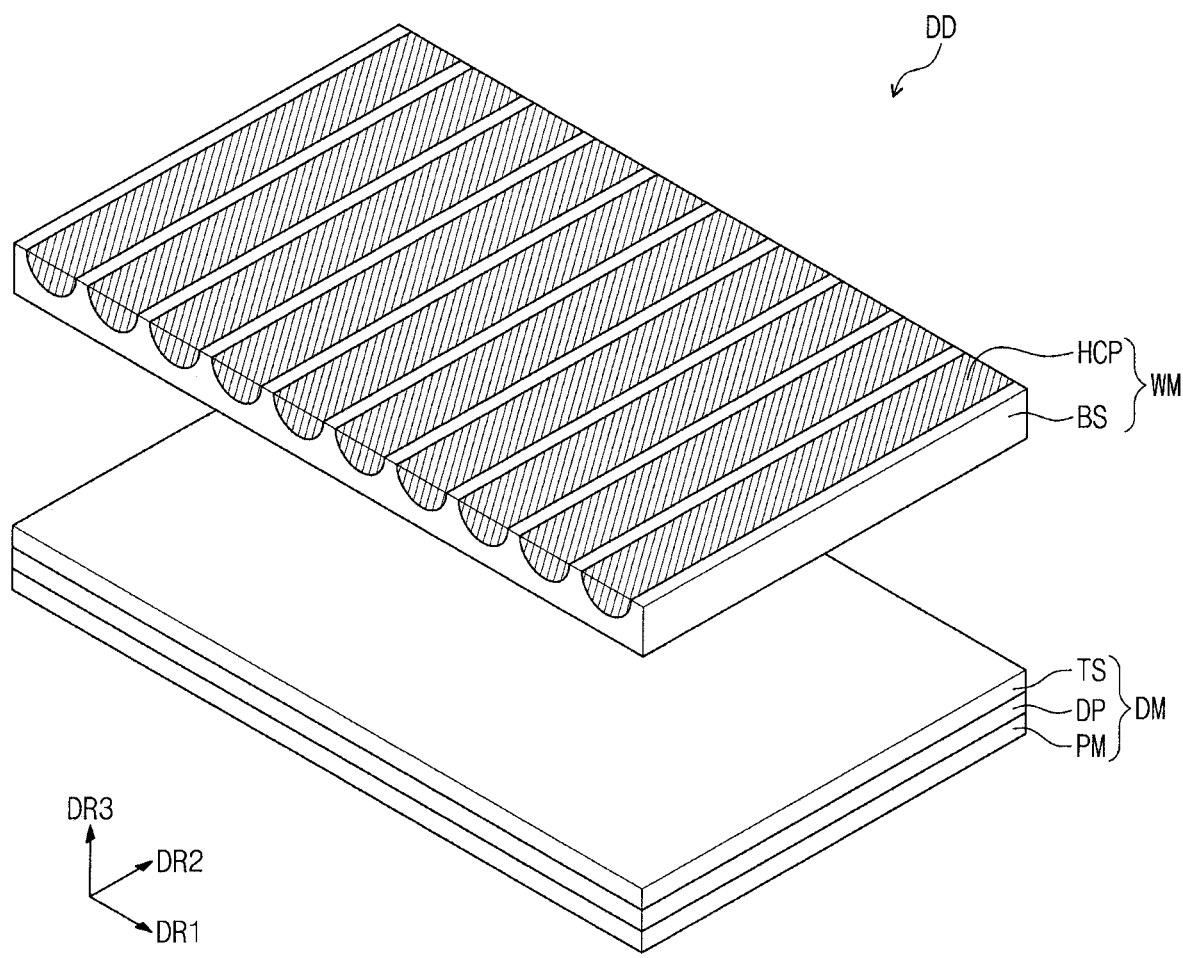
FIG. 2B is an exploded perspective view of a display apparatus according to an embodiment of the present disclosure.

FIG. 2A is a combined perspective view of a display apparatus according to an embodiment of the present disclosure. FIG. 2B is an exploded perspective view of a display apparatus according to an embodiment of the present disclosure. In FIGS. 2A-2B, components of the display apparatus illustrated in FIG. 1A are illustrated.

Referring to FIGS. 2A-2B, the display apparatus DD according to an embodiment of the present disclosure includes a window member WM and a display module DM. The display module DM may include a protection film PM, a display panel DP, and a touch sensing unit TS.

The display apparatus DD may further include a first adhesive member and a second adhesive member. The first adhesive member may combine the display panel DP and the protection film PM, and the second adhesive member may combine the display module DM and the window member WM.

A first adhesive member, a second adhesive member, and a third adhesive member may each be an optically clear adhesive film (OCA), an optically clear resin (OCR), or a pressure sensitive adhesive film (PSA). The first adhesive member, the second adhesive member, and the third adhesive member may each include a photo-curing adhesive material or a thermo-curing adhesive material, but a material thereof is not specifically limited.

The protection film PM and the window member WM may each be formed continuously through a coating process. The protection film PM protects the display module DM. The protection film PM prevents moisture from the outside from penetrating the display module DM (or reduces a likelihood or degree of such penetration of moisture), and absorbs an external impact.

The protection film PM may include a plastic film as a base member. The protection film may include a plastic film having one selected from the group consisting of polyethersulfone (PES), polyacrylate, polyetherimide (PEI), polyethylenenaphthalate (PEN), polyethyleneterephthalate (PET), polyphenylene sulfide (PPS), polyarylate, polyimide (PI), polycarbonate (PC), poly(arylene ether sulfone), and a combination thereof. As used herein, the terms "combination thereof" and "combinations thereof" may refer to a chemical combination (e.g., an alloy or chemical compound), a mixture, or a laminated structure of components.

A material composing the protection film PM is not limited to plastic resins, and may include organic/inorganic compound materials. The protection film PM may include a porous organic layer, and an inorganic material filling the pores of the organic layer. The protection film PM may further include a film-function layer formed on a plastic film. The film-function layer may include a resin layer. The film-function layer may be formed by means of a coating method.

The window member WM is disposed on the display module DM, and covers the display module DM. The window member WM may protect the display module DM from an external impact, and may provide a user with an input surface. A detailed explanation about the window member WM will be described later.

The display panel DP and the touch sensing unit TS may be formed being integrated with each other by means of a continuous process, but is not limited thereto. The touch sensing unit TS may be adhered to the display panel DP by means of an adhesive member. The display panel DP generates the image IM (See FIG. 1), corresponding to inputted image data.

The display apparatus DD may further include a frame structure to maintain the folded state illustrated in FIGS. 1B-1C. The frame structure may include a joint structure or a hinge structure.

Figure 3A:
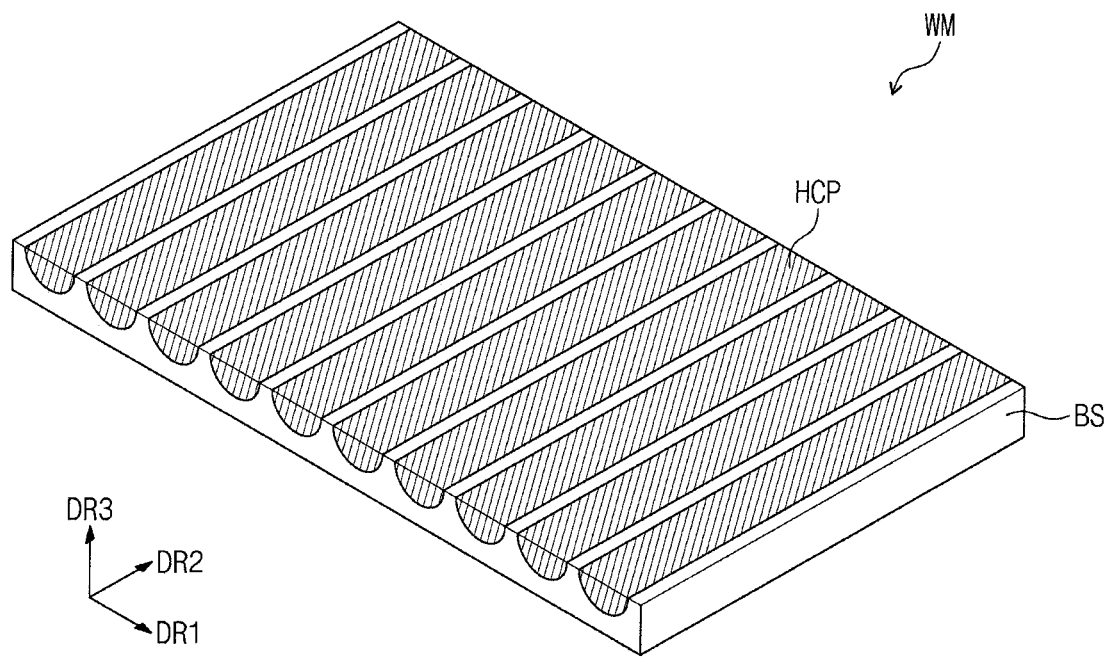
FIG. 3A is a perspective view of a window member according to an embodiment of the present disclosure.
Figure 3B:
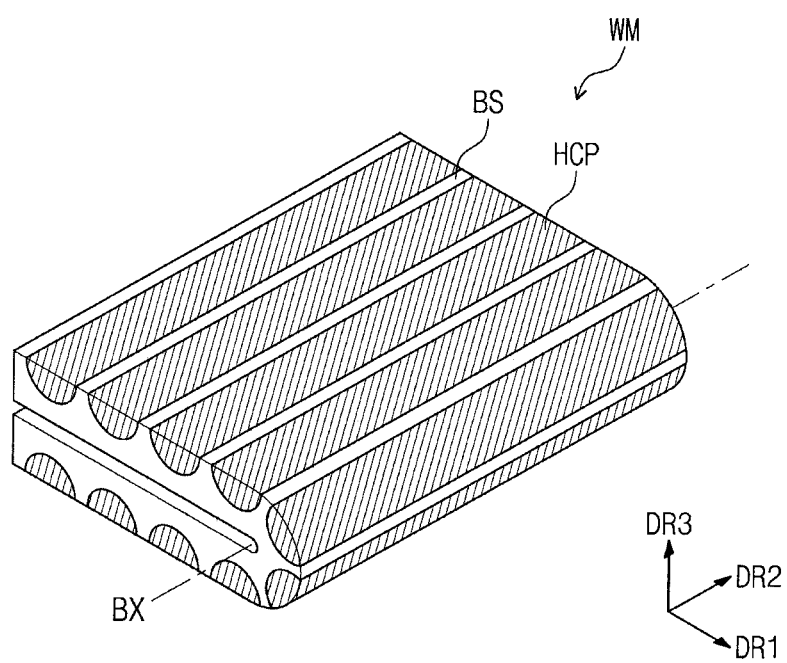
FIG. 3B is a perspective view showing the window member illustrated in FIG. 3A in a folded state.

FIG. 3A is a perspective view of a window member according to an embodiment of the present disclosure. FIG. 3B is a perspective view showing a window member according to an embodiment of the present disclosure in a folded state. Hereinafter, referring to FIGS. 3A-3B, the window member WM according to an embodiment of the present disclosure will be explained.

Referring to FIGS. 3A-3B, the window member WM according to an embodiment of the present disclosure includes a flexible base layer BS and a plurality of hard coating patterns HCP.

The flexible base layer BS may be formed of a polymer material. For example, the flexible base layer BS may be made of polyimide, polyacrylate, polymethylmethacrylate (PMMA), polycarbonate (PC), polyethylenenaphthalate (PEN), polyvinylidene chloride, polyvinylidene difluoride (PVDF), polystyrene, ethylene vinylalcohol copolymer, or a combination thereof. However, a material of the flexible base layer BS used in an embodiment is not limited to the listed polymer materials. Any suitable material can be used without limit as long as the material has optical transparency for providing a user with an image provided by a display module of a display apparatus. For example, the window member WM of an embodiment may use polyurethane (PU) as the flexible base layer BS. A flexible base layer made of PU may have excellent transparency, and may have high strength and high surface hardness.

On an upper surface of the flexible base layer BS, a plurality of concave patterns are defined. The plurality of hard coating patterns HCP are each disposed in a respective one of the plurality of concave patterns defined on the upper surface of the flexible base layer BS.

The plurality of hard coating patterns HCP have a greater hardness than the hardness of the flexible base layer BS. The plurality of hard coating patterns HCP may include a material having a higher rigidity than the rigidity of the flexible base layer BS. The hard coating patterns HCP may be organic patterns or organic/inorganic composite patterns. When the hard coating patterns HCP are organic patterns, the hard coating patterns HCP may include an acrylate-based compound. For example, the hard coating patterns HCP may include urethane acrylate. Or, the hard coating patterns HCP may include an epoxy-based compound.

When the hard coating patterns HCP are organic/inorganic composite patterns, the hard coating patterns HCP may be a blend of an organic matter and an inorganic particle. In this case, the organic matter may include an acrylate-based compound, and the inorganic particle may include an inorganic oxide. The inorganic oxide included in the inorganic particle may be one selected from the group consisting of a silicon oxide ($SiO_2$), a zirconium oxide ($ZrO_2$), an aluminium oxide ($Al_2O_3$), a tantalum oxide ($Ta_2O_5$), a niobium oxide ($Nb_2O_5$, $NbO_2$), a glass bead, and a combination thereof.

The difference in refractive index between the hard coating patterns HCP and the flexible base layer BS may be from 0 to about 0.2. The refractive index of the hard coating patterns HCP may be smaller than the refractive index of the flexible base layer BS by from 0 to about 0.2, or may be bigger by from 0 to about 0.1. The refractive index of the flexible layer BS may be from about 1.49 to about 1.50, and the refractive index of the hard coating patterns HCP may be from about 1.30 to about 1.60. Depending on whether or not the refractive index of the hard coating patterns HCP satisfies the above-mentioned range, it is possible to prevent haze or smudges from occurring to a window member (or to reduce a likelihood or degree of such haze or smudges), and to prevent the transmittance of a window member from decreasing due to the hard coating patterns HCP (or to reduce a likelihood or degree of such decrease in transmittance).

Each of the plurality of hard coating patterns HCP may be spaced apart from an adjacent one of the hard coating patterns HCP along the first direction DR1, and be extended along the second direction DR2, but is not limited thereto. Each of the plurality of hard coating patterns HCP may be spaced apart from an adjacent one of the hard coating patterns HCP along the second direction DR2, and be extended along the first direction DR1.

The window member WM may be bent or spread about the bending axis BX. A state in which the window member WM is bent about the bending axis BX may correspond to what is illustrated in FIG. 3B, and a state in which the window member WM is spread may correspond to what is illustrated in FIG. 3A.

The bending axis BX may be extended along the second direction DR2. Accordingly, each of the plurality of hard coating patterns HCP may be extended in a direction parallel (e.g., substantially parallel) to the bending axis BX. Each of the plurality of hard coating patterns HCP may be extended in a direction parallel (e.g., substantially parallel) to the bending axis BX, and be spaced apart from an adjacent one of the hard coating patterns HCP in a direction crossing the bending axis BX.

A window member according to an embodiment of the present disclosure does not have a hard coating layer formed on a front surface of a flexible base layer, but have a plurality of hard coating patterns patterned. Accordingly, it is possible to prevent a hard coating layer from being broken or transformed when a window member is folded when the hard coating layer is formed on a front surface of a flexible base layer (or to reduce a likelihood or degree of such breakage or transformation). Especially, a window member according to an embodiment of the present disclosure may have a plurality of hard coating patterns extended in a direction parallel (e.g., substantially parallel) to a bending axis. Accordingly, a stress occurring when a window member is folded along a bending axis is not stressed in a direction in which a plurality of hard coating patterns are extended, and therefore, it is possible to prevent a hard coating layer from being broken or transformed (or to reduce a likelihood or degree of such breakage or transformation).

Figure 4A:
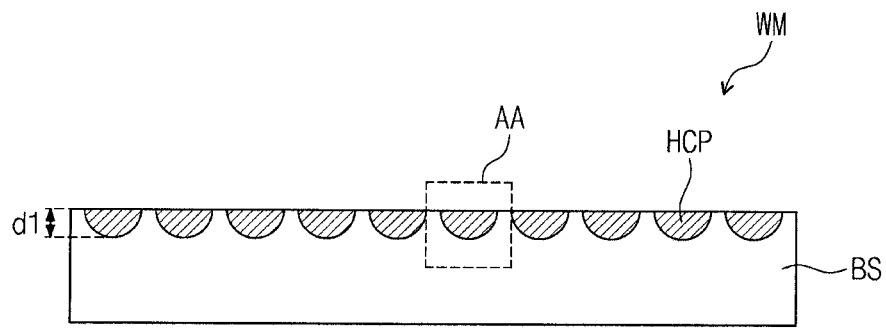
FIG. 4A is a cross-sectional view of a window member according to an embodiment of the present disclosure.
Figure 4B:
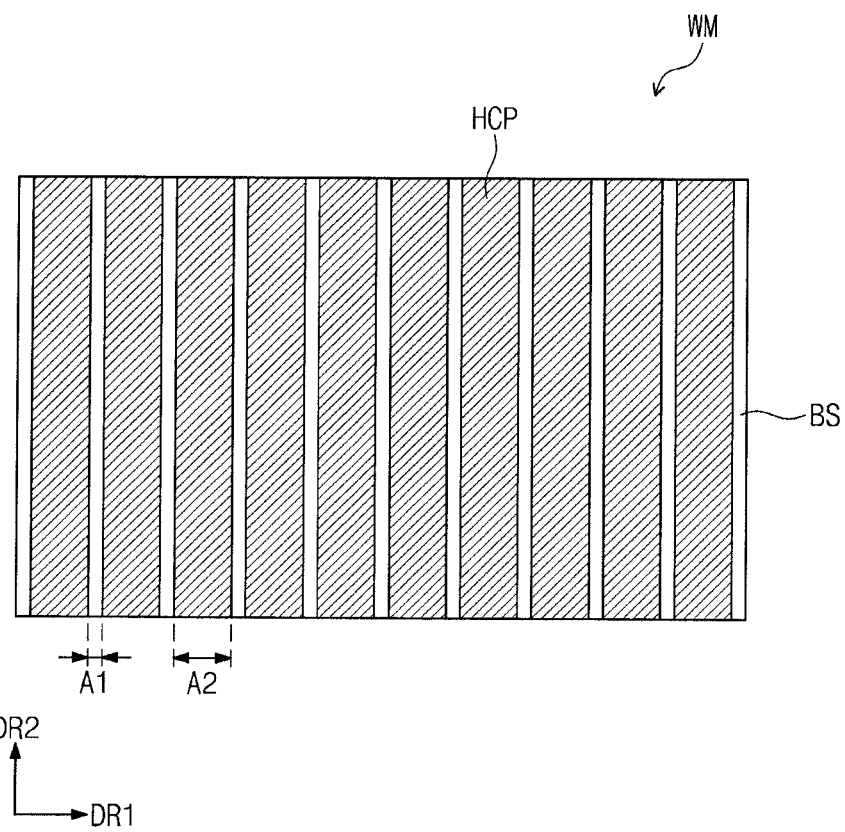
FIGS. 4B-4C are plan views of a window member according to an embodiment of the present disclosure.

FIG. 4A is a cross-sectional view of a window member according to an embodiment of the present disclosure. FIG. 4B is a plan view of a window member according to an embodiment of the present disclosure. Hereinafter, referring to FIG. 3A, FIG. 4A, and FIG. 4B together, a window member according to an embodiment of the present disclosure will be explained.

Referring to FIG. 3A and FIG. 4A, an upper surface of the window member WM may be defined by the flexible base layer BS and the hard coating patterns HCP. The upper surface of the window member WM may be defined by an upper surface of the flexible base layer BS on which concave patterns are respectively disposed, and by an upper surface of the flexible base layer BS on which concave patterns are not positioned.

The upper surface of the window member WM may be a substantially flat plane. The upper surface of the window member WM may be flat without having protrusions. An upper surface of the hard coating patterns HCP on which concave patterns are disposed may be coupled to (e.g., connected to) an upper surface of the flexible base layer BS on which concave patterns are not positioned, and may define a substantially flat plane.

A window member according to an embodiment of the present disclosure has a plurality of hard coating patterns disposed on an upper portion of a flexible base layer without steps. For example, a plurality of hard coating patterns fill a plurality of concave patterns defined on an upper portion of a flexible base layer such that an upper surface of a window member takes a shape having no steps. Accordingly, since an upper surface of a window member forms a flat plane, and hard coating patterns do not protrude to the outside, it is possible to prevent hard coating patterns from breaking away from a window member when a window member is folded or rolled (or to reduce a likelihood or degree of such breaking away), and the problem of protruded hard coating patterns breaking away or being damaged when a surface is scratched by an object on the outside does not occur. In addition, it is possible to prevent haze from occurring on a display device due to steps when hard coating patterns are protruded (or to reduce a likelihood or degree of such haze).

Referring to FIG. 4B, the upper surface of the window member WM may be divided into a base area A1 defined by the flexible base layer BS, and a pattern area A2 defined by the plurality of hard coating patterns HCP. In a window member according to an embodiment of the present disclosure, the pattern area A2 may be extended along the second direction DR2 and be spaced apart from adjacent pattern areas A2 along the first direction DR1.

The pattern area A2 may occupy from about 70% to about 90% of the entire area of the upper surface of the window member WM. Depending on whether or not the area occupied by the pattern area A2 satisfies the above mentioned range, a window member may have flexibility and at the same time enough resistance to a scratch by an external impact.

Figure 4C:
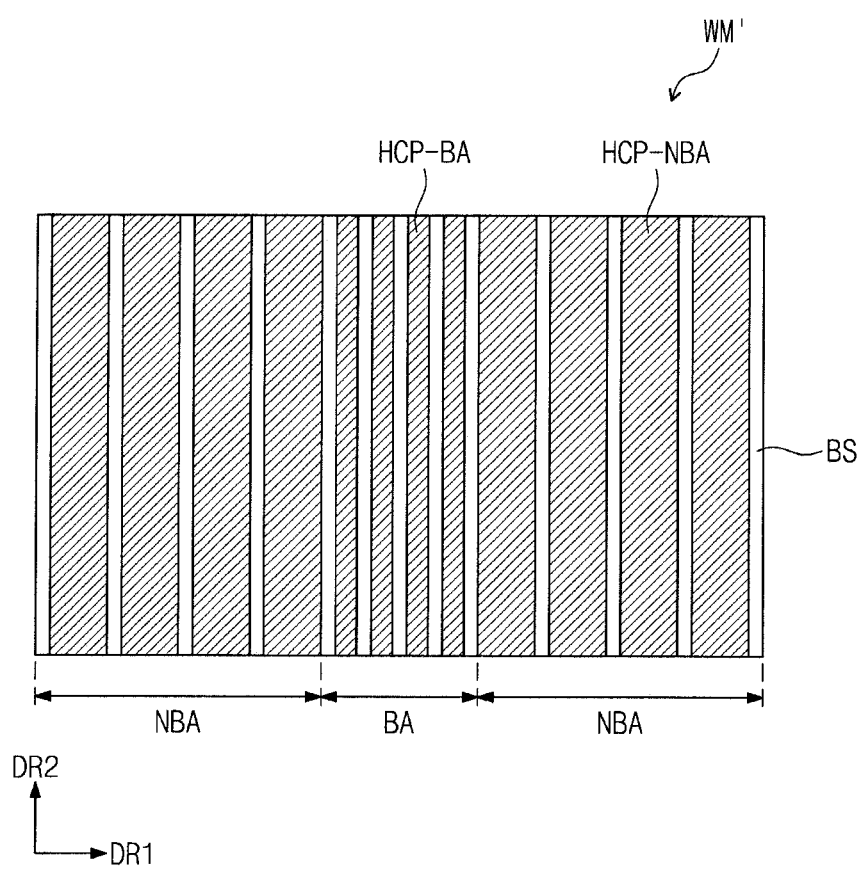

FIG. 4C is a plan view of a window member according to an embodiment of the present disclosure.

Referring to FIG. 4C, an upper surface of a window member WM' may be divided into a first area BA in which the window member WM' is bent or spread, and a second area BNA adjacent to the first area BA. The second area NBA may be a flat area in which the window member WM' is not bent. In FIG. 4C, one first area BA, and second areas NBA disposed on each side of the first area BA are exemplarily illustrated, but are not limited thereto. The first area BA may be disposed on the upper surface of the window member WM' in a plurality.

On the upper surface of the window member WM' according to an embodiment of the present disclosure, the proportion of the pattern area A2 on which hard coating patterns are disposed may be defined differently to the first area BA and to the second area NBA. For example, the proportion of the pattern area A2 defined in the first area BA may be smaller than the proportion of the pattern area A2 defined in the second area NBA. A plurality of first hard coating patterns HCP-BA disposed in the first area BA may have a wider width along a first direction on a plane than a plurality of second hard coating patterns HCP-NBA.

A window member according to an embodiment of the present disclosure may have a smaller proportion of hard coating patterns disposed in a folded region than in a non-folded region. Accordingly, the flexibility of a window member in the folded region may increase, and in the non-folded region, a bigger proportion of hard coating patterns are disposed such that the hardness of the window member may increase and scratch resistance thereof may go up.

Figure 5A:
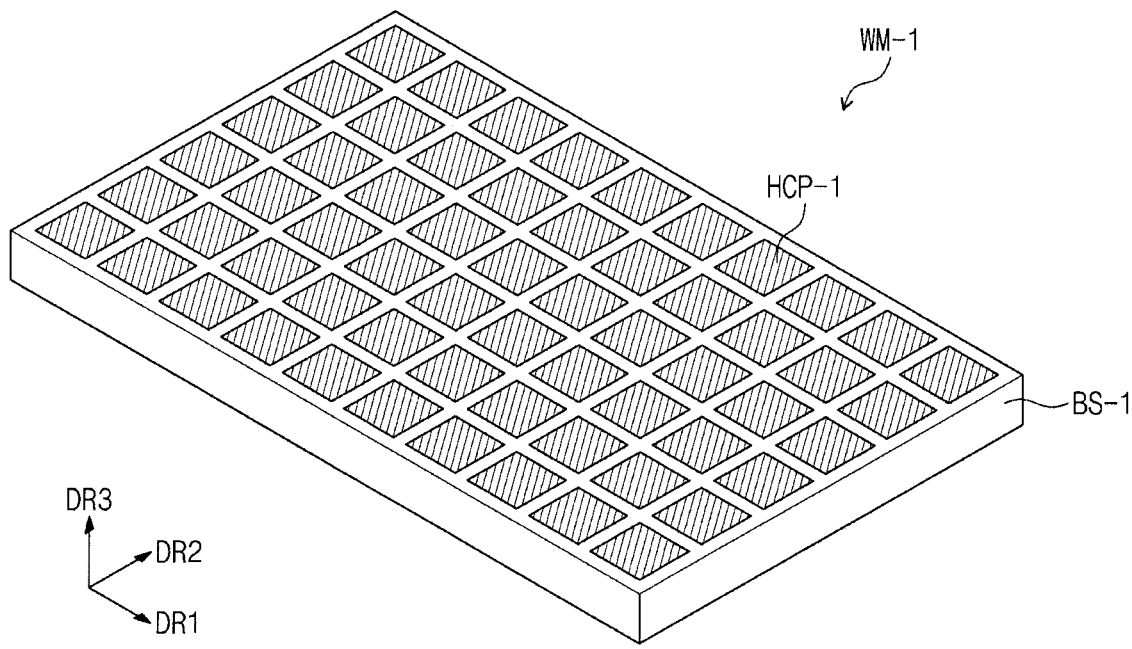
FIG. 5A is a perspective view of a window member according to an embodiment of the present disclosure.
Figure 5B:
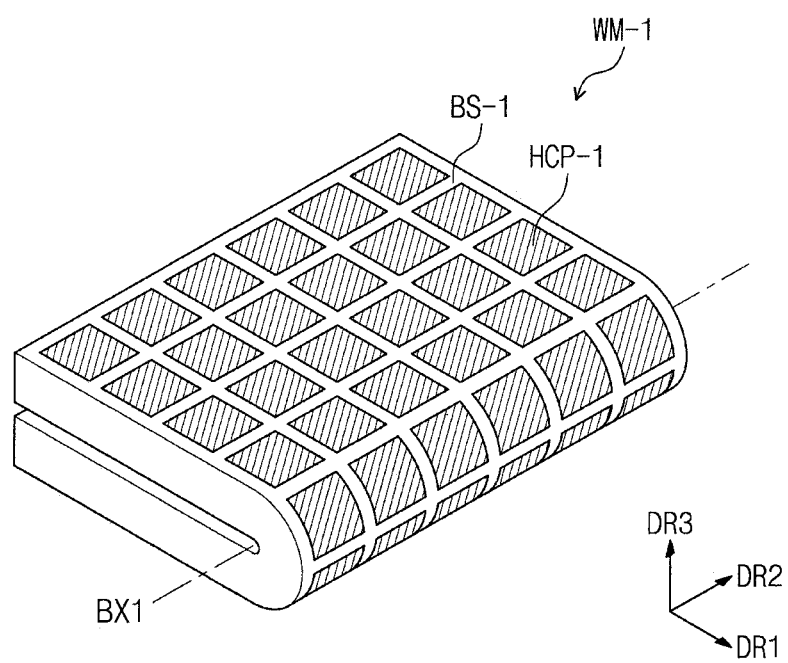
FIGS. 5B-5C are perspective views showing the window member illustrated in FIG. 5A in a state of being folded in one direction.
Figure 5C:
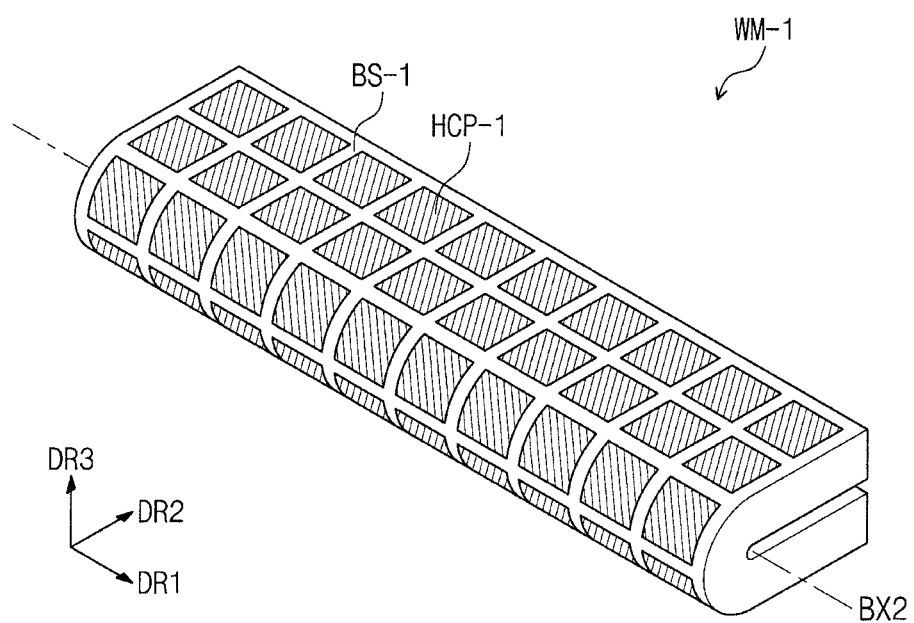

FIG. 5A is a perspective view of a window member according to another embodiment of the present disclosure in an unfolded state. FIG. 5B is perspective view showing the window member illustrated in FIG. 5A in a state of being folded in one direction. FIG. 5C is a perspective view showing the window member illustrated in FIG. 5A in a state of being folded in the other direction. Hereinafter, referring to FIG. 5A to FIG. 5C, a window member WM-1 according to an embodiment of the present disclosure will be explained. Meanwhile, the same or substantially the same configurations as the configurations explained in FIGS. 3A-FIG. 3B are assigned the same or substantially the same reference numerals, and therefore, duplicate explanations thereof are not necessary here.

The window member WM-1 includes a flexible base layer BS-1 and a plurality of hard coating patterns HCP-1 may be arranged in a matrix form by being spaced apart respectively along the first direction DR1 and the second direction DR2. The plurality of hard coating patterns HCP-1 may include pattern rows spaced apart along the first direction DR1, and include pattern lines spaced apart along the second direction DR2. In FIGS. 5A-5B, each pattern spaced apart at equal intervals along the first direction DR1 and the second direction DR2 is exemplarily described, but is not limited thereto. Intervals spaced apart along the first direction DR1 and intervals spaced apart along the second direction DR2 may be different from each other.

The window member WM-1 may be bent or spread about a first bending axis BX1. The first bending axis BX1 may be extended along the second direction DR2. A window member WM-1 may be bent or spread about a second bending axis BX2. The second bending axis BX2 may be extended along the first direction DR1. The plurality of hard coating patterns HCP-1 may be arranged in a matrix form by being spaced apart in a direction parallel (e.g., substantially parallel) to the first bending axis BX1 and by being spaced apart in a direction parallel to the second bending axis BX2.

A window member according to an embodiment of the present disclosure may be folded along a plurality of axes. For example, a window member may be folded along two axes crossing each other. A window member according to an embodiment of the present disclosure has a plurality of hard coating patterns arranged in a matrix form such that even when a window member is folded along any one of two bending axes, stress is not stressed in a direction in which hard coating patterns are extended, and therefore, it is possible to prevent a hard coating layer from being broken or transformed (or to reduce a likelihood or degree of such breakage or transformation).

Figure 6A:
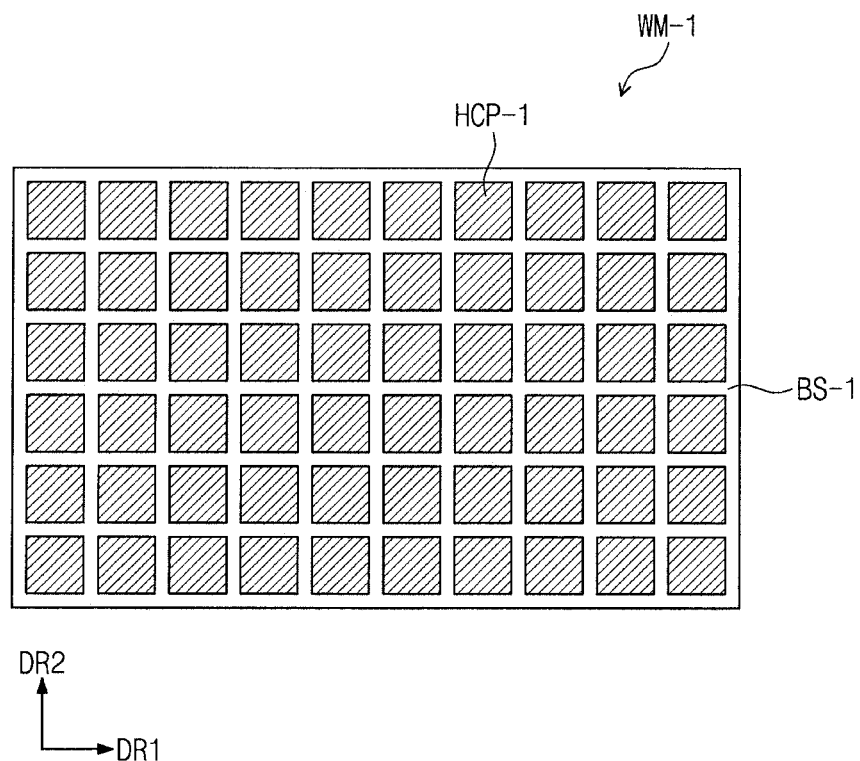
FIGS. 6A-6C are plan views of a window member according to an embodiment of the present disclosure.
Figure 6B:
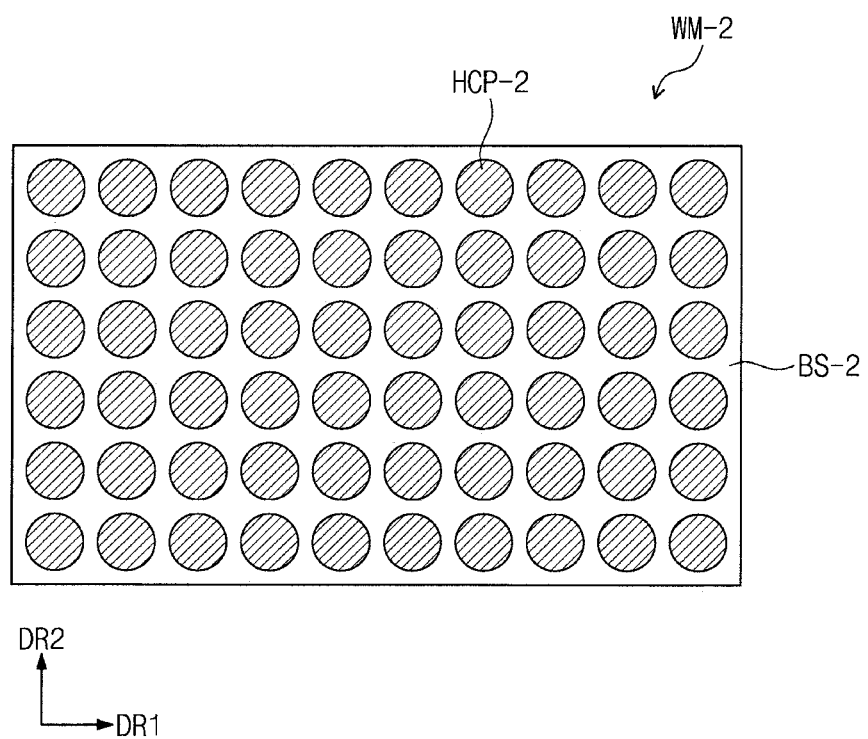
Figure 6C:
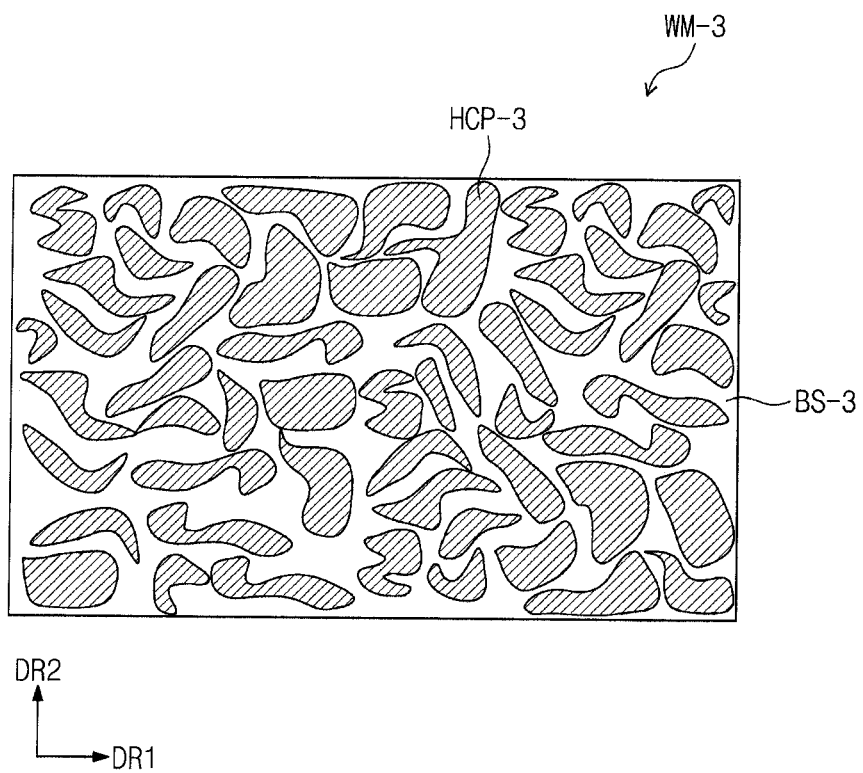

FIG. 6A is a plan view of a window member according to an embodiment of the present disclosure. FIG. 6B is a plan view of a window member according to another embodiment of the present disclosure. FIG. 6C is a plan view of a window member according to the other embodiment of the present disclosure. Meanwhile, the same or substantially the same configurations as the configurations explained in FIG. 4B are assigned the same or substantially the same reference numerals, and therefore, duplicate explanations thereof are not necessary here.

The plurality of hard coating patterns HCP-1 may be arranged in a matrix form by being spaced apart respectively along the first direction DR1 and the second direction DR2. Each of the plurality of hard coating patterns HCP-1 may have a rectangular shape on a plane as illustrated in FIG. 6A. Or, in a window member WM-2 including a flexible base layer BS-2, each of a plurality of hard coating patterns HCP-2 may have a circular shape on a plane as illustrated in FIG. 6B. In a window member WM-3 including a flexible base layer BS-3, each of a plurality of hard coating patterns HCP-3 may be disposed randomly without regularity as illustrated in FIG. 6C. When a plurality of hard coating patterns are disposed as illustrated in FIGS. 6B-6C, a display apparatus may be a stretchable display apparatus.

Figure 7A:
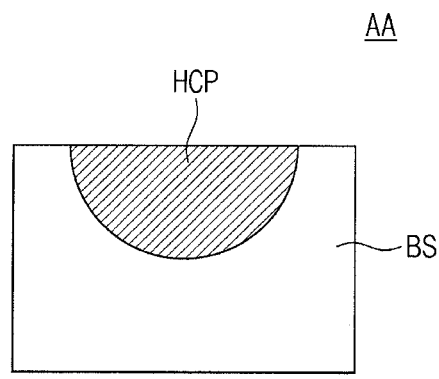
FIG. 7A is an enlarged cross-sectional view of the AA section of FIG. 4A.
Figure 7B:
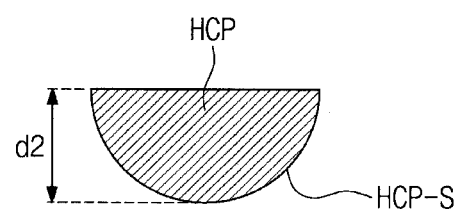
FIG. 7B is an exploded cross-sectional view of the configurations illustrated in FIG. 7A.
Figure 7B:
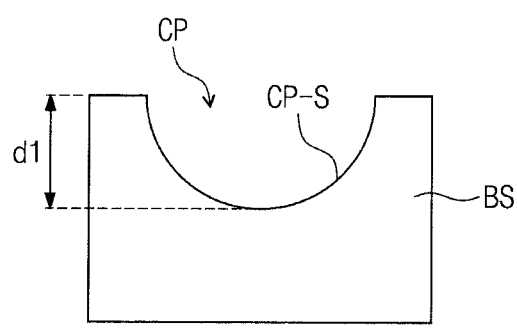

FIG. 7A is an enlarged cross-sectional view of the AA section of FIG. 4A. FIG. 7B is an exploded cross-sectional view of the configurations illustrated in FIG. 7A. Hereinafter, referring to FIGS. 7A-7B, the arrangement of the flexible base layer BS and the hard coating patterns HCP in the window member WM according to an embodiment of the present disclosure will be explained.

Each of the hard coating patterns HCP is disposed in a respective one of a plurality of concave patterns CP defined in an upper portion of the flexible base layer BS. Each of the hard coating patterns HCP is disposed in a respective one of the concave patterns CP corresponding thereto. Each of the hard coating patterns HCP may fill a corresponding space defined by the concave patterns CP. Each of the plurality of hard coating patterns HCP may have the identical (e.g., substantially identical) shape as a space defined by the concave patterns CP.

The thickness d2 of each of the hard coating patterns HCP may be the same or substantially the same as the thickness d1 of each of the concave patterns CP. For example, the thickness d2 of each of the hard coating patterns HCP and/or the thickness d1 of each of the concave patterns CP may be from about 5 μm to about 20 μm. Depending on whether or not the thickness of the hard coating patterns HCP satisfy the above mentioned range, a window member may have enough scratch resistance, and flexibility such that it is possible to fold or roll a window member.

Each of the hard coating patterns HCP may include a bottom surface HCP-S each corresponding to an inner surface CP-S which defines an inner space of the concave patterns CP. The bottom surface HCP-S of each of the hard coating patterns HCP may have a shape substantially corresponding to the inner surface CP-S of the concave patterns CP. Since the bottom surface HCP-S of the hard coating patterns HCP substantially correspond to the inner surface CP-S of the concave patterns CP, each of the hard coating patterns HCP completely fill the concave patterns CP, and may not protrude out of an upper surface of a window member.

Figure 8A:
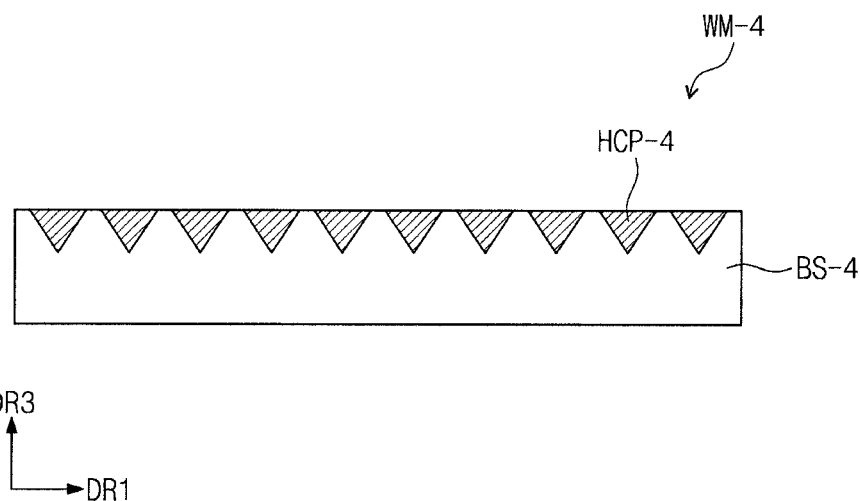
FIGS. 8A-8B are perspective views of a window member according to an embodiment of the present disclosure.
Figure 8B:
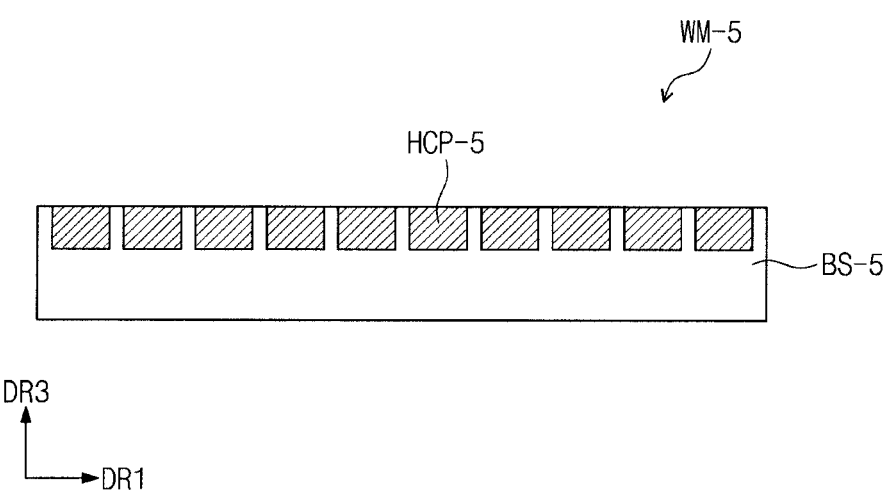

FIG. 8A is a perspective view of a window member according to another embodiment of the present disclosure. FIG. 8B is a perspective view of a window member according to another embodiment of the present disclosure. FIGS. 8A-8B illustrate a window member having different shapes of hard coating patterns from the window member illustrated in FIG. 4A. Hereinafter, referring to FIG. 4A, FIG. 8A, and FIG. 8B, a window member according to an embodiment of the present disclosure will be explained. Meanwhile, the same or substantially the same configurations as the configurations explained in FIG. 4A are assigned the same or substantially the same reference numerals, and therefore, duplicate explanations thereof are not necessary here.

Hard coating patterns according to an embodiment of the present disclosure may have various suitable shapes when viewed in a cross section. The hard coating patterns HCP may be of a semicircular shape when viewed in a cross section as illustrated in FIG. 4A. Or, hard coating patterns HCP-4 may be of a triangular shape of a pyramid when viewed in a cross section as illustrated in with respect to a window member WM-4 of FIG. 8A, which includes flexible base layer BS-4. Hard coating patterns HCP-5 may be of a rectangular shape when viewed in a cross section as illustrated with respect to a window member WM-5 in FIG. 8B, which includes a flexible base layer BS-5, but the present disclosure is not limited thereto. Hard coating patterns may be provided having various suitable shapes that are the same or substantially the same as shapes of concave patterns defined on an upper surface of a flexible base layer.

A manufacturing method of a display apparatus according to an embodiment of the present disclosure includes the following steps: preparing a display module including a display surface configured to display an image, providing a window member, and combining the window member onto the display surface.

Hereinafter, a manufacturing method of a window member included in a display apparatus according to an embodiment of the present disclosure will be explained.

Figure 9:
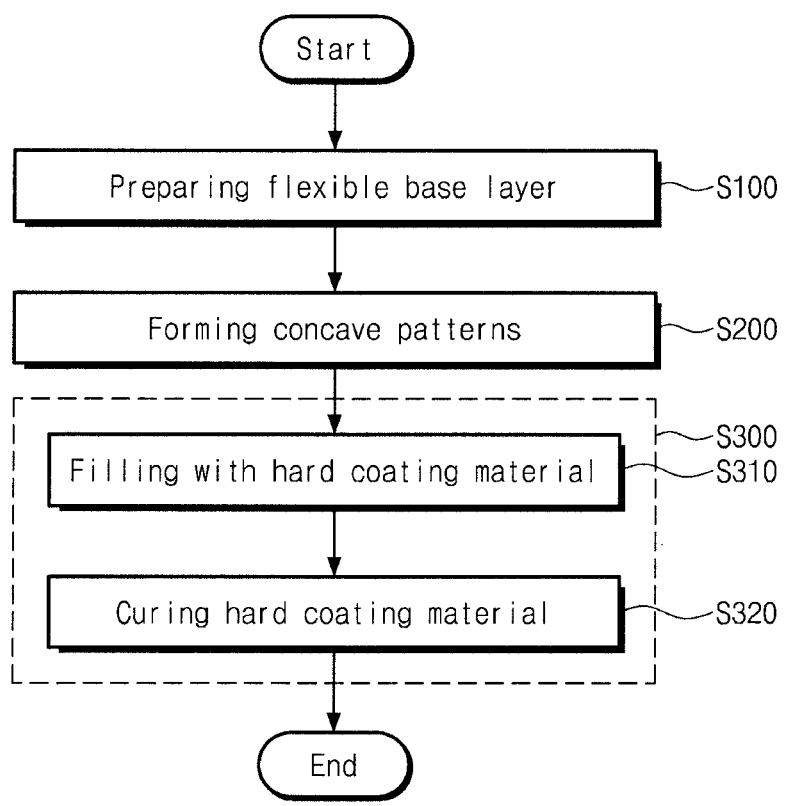
FIG. 9 is a flow chart illustrating a manufacturing method of a window member according to an embodiment of the present disclosure.

FIG. 9 is a flow chart illustrating a manufacturing method of a window member according to an embodiment of the present disclosure. FIG. 10A to FIG. 10E are perspective views sequentially illustrating a manufacturing method of a window member according to an embodiment of the present disclosure.

As illustrated in FIG. 9, a manufacturing method of a window member according to an embodiment of the present disclosure includes the following steps: preparing a flexible base layer S100, forming a plurality of concave patterns on the flexible base layer S200, and forming a plurality of hard coating patterns in respective ones of the concave patterns S300. The step of forming a plurality of hard coating patterns S300 may include steps of filling each of the concave patterns with a hard coating material S310 and curing the hard coating material S320.

Figure 10A:
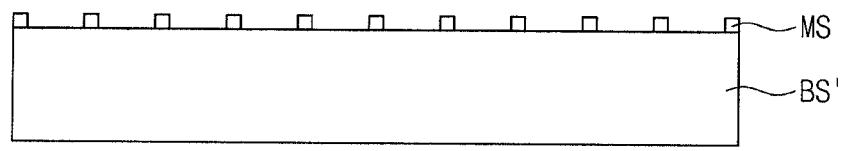
FIGS. 10A-10E are perspective views sequentially illustrating a manufacturing method of a window member according to an embodiment of the present disclosure.

Referring to FIG. 9 and FIG. 10A, a flexible base layer BS' is prepared, and a mask MS may be provided on the flexible base layer BS'. Since there are a plurality of openings defined in the mask MS, at least a portion of an upper surface of the flexible base layer BS' may be exposed.

Figure 10B:
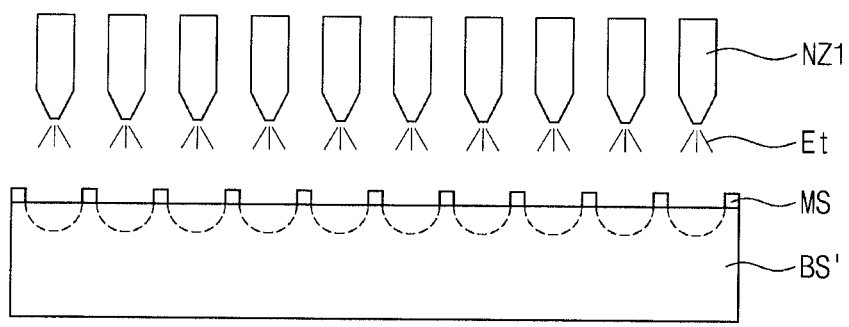

Referring to FIG. 9 and FIG. 10B, a manufacturing method of a window member according to an embodiment of the present disclosure includes a step of forming a plurality of concave patterns on the flexible base layer BS' on which the mask MS S200 is provided. The step of forming the plurality of concave patterns S200 may be performed by using an etching process. The plurality of concave patterns may be formed through dry etching methods, such as plasma etching, ion beam etching, laser etching and the like, or through a wet matching method providing an etching solution Et provided by a plurality of nozzles NZ1, as shown in FIG. 10B. The plurality of concave patterns may be formed through oxygen ($O_2$) plasma etching or nitrous oxide ($N_2O$) plasma etching.

Figure 10C:
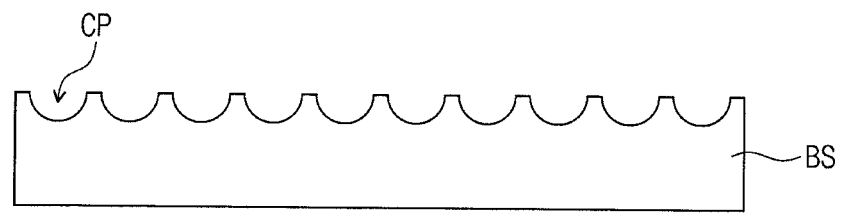

Referring to FIGS. 10B-10C, the plurality of concave patterns CP are formed on an upper portion of the flexible base layer BS through an etching process, and the like. A region of an upper surface of the base layer BS, on which the mask MS is provided before an etching step, is not etched because plasma and the like is unable to reach. The plurality of concave patterns CP are formed through an etching process on an upper surface of the flexible base layer BS, which is exposed due to a plurality of openings defined by the mask MS. In FIG. 10C, concave patterns CP having a semicircular shape when viewed in a cross section as illustrated in FIG. 4A are exemplary illustrated, but are not limited thereto. Concave patterns CP of various suitable shapes may be formed. In a step of forming concave patterns, concave patterns without regularity may be formed by being provided with a random mask before an etching step.

On each surface of the concave patterns CP of the flexible base layer BS', a plurality of first functional groups may be formed through an etching process. The plurality of first functional groups may be formed as a chemical combination in a polymer included in the flexible base layer BS' is broken by oxygen plasma and the like. The plurality of first functional groups may be at least one selected from a hydroxyl group (—OH), a carboxyl group (—COOH), or an isocyanate group (—NCO).

Figure 10D:
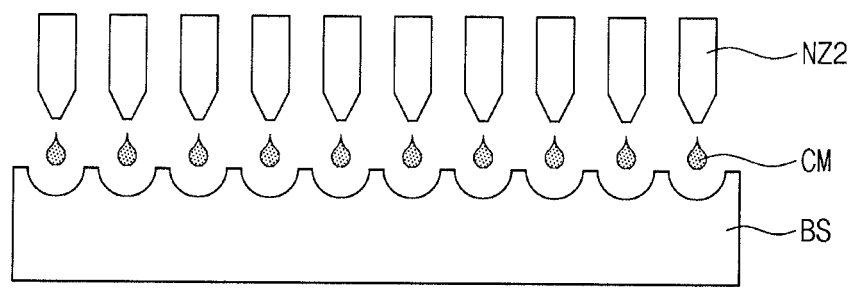

Referring to FIG. 9 and FIG. 10D, a hard coating material CM may be filled in each of the concave patterns formed on the flexible base layer BS utilizing a plurality of nozzles NZ2 as shown in FIG. 10D. The hard coating material CM may be provided in a liquid form, and fill a space defined by each of the concave patterns. The hard coating material CM may be provided by means of silk screen printing, inkjet printing, spray coating, or a roll-to-toll process.

A second functional group may be included in the hard coating material CM. The second functional group may be at least one selected from a hydroxyl group (—OH), a carboxyl group (—COOH), and an isocyanate group (—NCO). The second functional group may react with the first functional group and be chemically combined therewith (e.g., the second functional group may react with the first functional group to form a chemical bond). As the second functional group included in the hard coating material CM is chemically combined with the first functional group formed on surfaces of concave patterns, a plurality of hard coating patterns in a window member according to an embodiment of the present disclosure may not easily break away from the concave patterns. In this case, the first functional group and the second functional group may be combined through the urethane bond (e.g., the first functional group and the second functional group may chemically react to form a urethane bond).

Figure 10E:
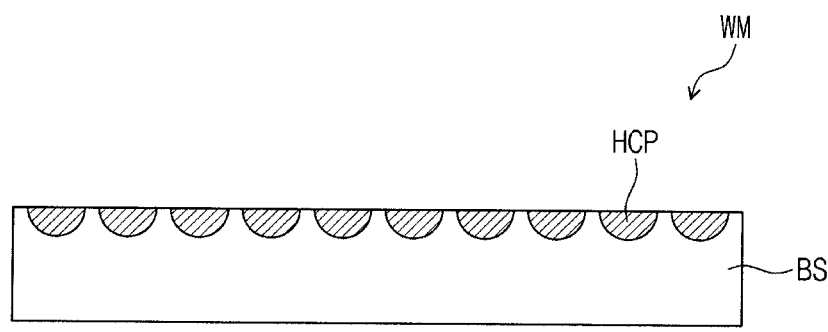

Thereafter, the plurality of hard coating patterns HCP are formed on an upper portion of the flexible base layer BS as illustrated in FIG. 10E by curing hard coating material filled in a plurality of concave patterns. The plurality of hard coating patterns HCP are formed by having a hard coating material be filled corresponding to the shapes of the plurality of concave patterns, and by curing the filled hard coating material thereof. Therefore, steps may not be formed on an upper surface of the window member WM. Accordingly, since the upper surface of the window member forms a substantially flat plane and hard coating patterns do not protrude to the outside, the hard coating patterns do not easily break away when the window member is folded or rolled, and the problem of protruded hard coating patterns breaking away or being damaged when a surface is scratched by an object on the outside does not occur. Also, it is possible to prevent haze from occurring in a display apparatus due to steps when the hard coating patterns are protruded (or to reduce a likelihood or degree of such haze).

Figure 11:
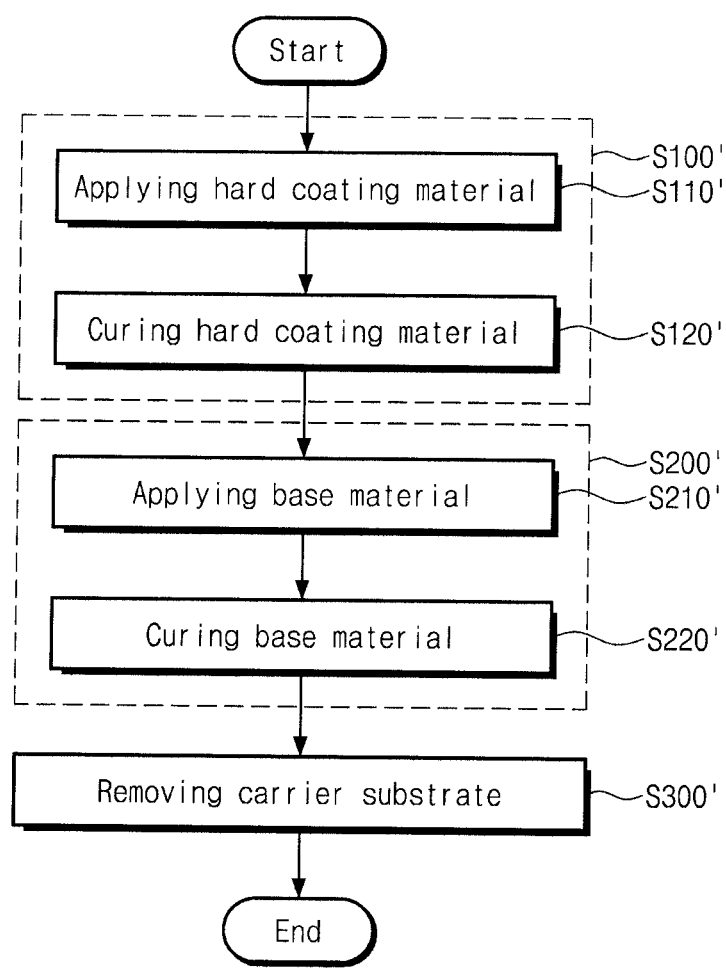
FIG. 11 is a flow chart illustrating a manufacturing method of a window member according to an embodiment of the present disclosure.

FIG. 11 is a flow chart illustrating a manufacturing method of a window member according to another embodiment of the present disclosure. FIG. 12A to FIG. 12E are perspective views sequentially illustrating a manufacturing method of a window member according to another embodiment of the present disclosure.

As illustrated in FIG. 11, a manufacturing method of a display apparatus according to an embodiment of the present disclosure may include the following steps: forming a plurality of hard coating patterns on a carrier substrate S100', forming a flexible base layer to cover the hard coating patterns entirely (e.g., substantially entirely) S200', and removing the carrier substrate S300'. The step of forming hard coating patterns S100' may include a step of applying a hard coating material to be extended in one direction and be spaced apart in a direction crossing the one direction S110', and a step of curing the hard coating material S120'. The step of forming a flexible base layer S200' may include a step of applying a base material S210' to cover the hard coating patterns and fill the spaces spaced apart among the hard coating patterns, and a step of curing the base material S220'.

Figure 12A:
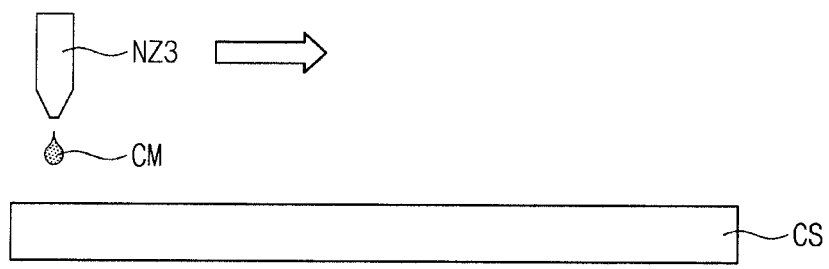
FIGS. 12A-12E are perspective views sequentially illustrating a manufacturing method of a window member according to an embodiment of the present disclosure.

Referring to FIG. 11 and FIG. 12A, the carrier substrate CS is prepared, and the hard coating material CM is applied on the carrier substrate CS utilizing a nozzle NZ3 as shown in FIG. 12A. The hard coating material CM may be applied to be extended along one direction, and be spaced apart in a direction crossing the one direction. For example, the hard coating material CM may be patterned and applied to be extended in the second direction DR2 (See FIG. 4B), and be spaced apart from each other in the first direction DR1 (See FIG. 4B) crossing the second direction DR2, but is not limited thereto. The hard coating material CM may be applied to be arranged in a matrix form on the carrier substrate CS, or be randomly applied without regularity.

Figure 12B:
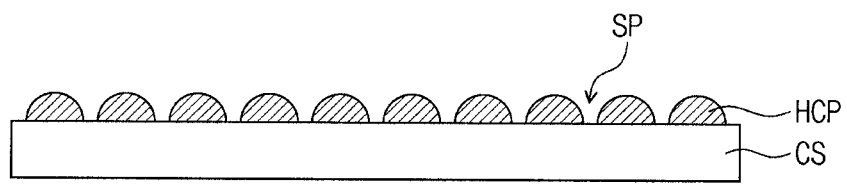

Referring to FIG. 11 and FIG. 12B, the plurality of hard coating patterns HCP may be formed by curing the applied hard coating material. The plurality of hard coating patterns HCP may be formed being spaced apart at set (e.g., predetermined) intervals on the carrier substrate CS. Among each of the plurality of hard coating patterns HCP, separated spaces SP may be defined.

On surfaces of the plurality of hard coating patterns HCP, a first functional group may be included. For example, the first functional group may be exposed to the outside on the surfaces of the plurality of hard coating patterns HCP. The first functional group may be at least one selected from a hydroxyl group (—OH), a carboxyl group (—COOH), or an isocyanate group (—NCO).

Figure 12C:
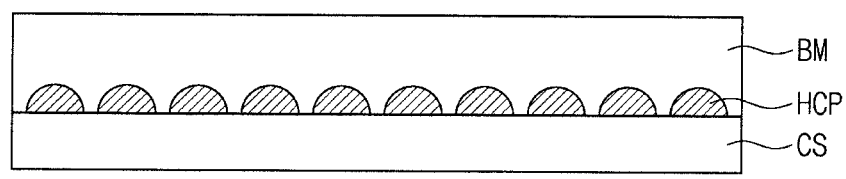

Referring to FIG. 11 and FIG. 12C, the base material BM is applied to cover the plurality of hard coating patterns HCP. The base material BM may be applied to fill separated spaces among the hard coating patterns HCP. Accordingly, the surface of the carrier substrate CS is not exposed to the outside in the separated spaces among the hard coating patterns HCP.

A second functional group may be included in the base material BM. At least one of materials included in the base material BM may be a material including the second functional group. The second functional group may be at least one selected from a hydroxyl group (—OH), a carboxyl group (—COOH), or an isocyanate group (—NCO). When the base material BM is applied to cover the hard coating patterns HCP, the first functional group and the second functional group may be chemically combined such that the plurality of hard coating patterns HCP may not easily break away from the base material BM. In this case, the first functional group and the second functional group may be combined through the urethane bond (e.g., the first functional group and the second functional group may react to form a urethane bond).

Figure 12D:
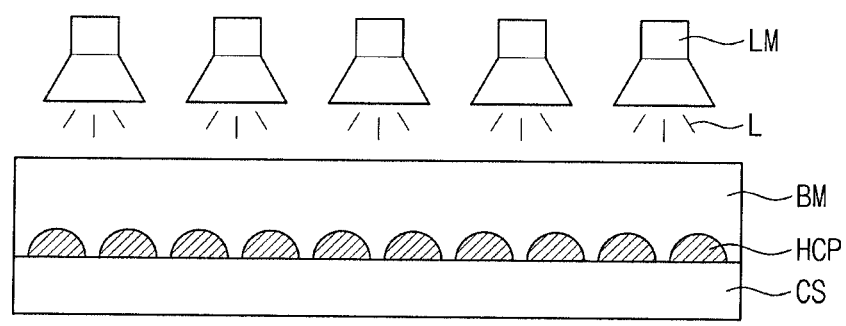
Figure 12E:
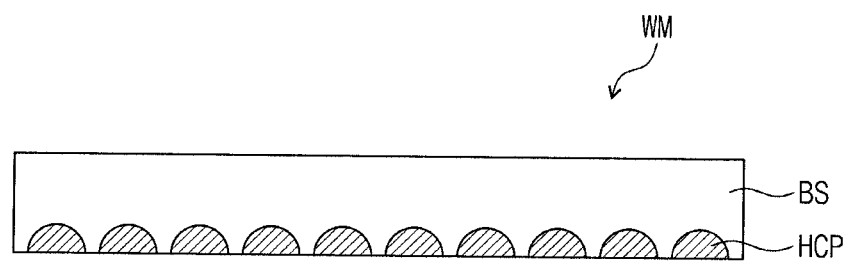

Referring to FIG. 11, FIG. 12D, and FIG. 12E, the flexible base layer BS is formed by curing the applied base material BM. In FIG. 12D, the base material BM being cured by light L from a plurality of lamps LM, but the present disclosure is not limited thereto. The base material BM may be cured through various suitable methods. After the flexible base layer BS is formed by curing the base material BM, the carrier substrate CS is removed and the window member WM is finally formed.

A window member according to an embodiment of the present disclosure may be formed by first forming hard coating patterns on a carrier substrate, and then forming a flexible base layer to cover the hard coating patterns such that no steps are formed on a surface on which hard coating patterns are formed and one surface of the window member is formed to be a flat plane. A window member according to an embodiment of the present disclosure has hard coating patterns not protruding to the outside such that the hard coating patterns do not break away easily when the window member is folded or rolled, and the problem of having protruded hard coating patterns breaking away or being damaged by an object when a surface is scratched by an object on the outside does not occur. Also, it is possible to prevent haze from occurring due to steps when the hard coating patterns are protruded (or to reduce a likelihood or degree of such haze).

A display apparatus according to an embodiment of the present disclosure may be strongly resistant to external scratches and at the same time may secure flexibility when folded or rolled.

A manufacturing method of a window member according to an embodiment of the present disclosure may provide a display apparatus having strong resistance to external scratches and at the same time having secured flexibility when folded or rolled.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

The above-disclosed subject matter is to be considered illustrative and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A display apparatus comprising:
a display module comprising a display surface configured to display an image; and
a window member disposed on the display surface, wherein the window member comprises:
a flexible base layer having a plurality of concave patterns defined on an upper portion thereof; and
a plurality of hard coating patterns each disposed in a corresponding concave pattern among the concave patterns and having a hardness greater than the hardness of the flexible base layer,
wherein each of the plurality of hard coating patterns is a semicircular shape when viewed in a cross section,
wherein the flexible base layer comprises a first functional group, and the plurality of hard coating patterns each comprises a second functional group, and
the second functional group is chemically combined with the first functional group,
wherein the plurality of hard coating patterns comprise an acrylate-based compound or an epoxy-based compound, and the flexible base layer comprises polyurethane or polycarbonate, and
the first functional group and the second functional group are at least one selected from the group consisting of a hydroxyl group (—OH), a carboxyl group (—COOH), and an isocyanate group (—NCO).

2. The display apparatus of claim 1, wherein:
the concave patterns have a set depth in the thickness direction of the flexible base layer; and
each of the hard coating patterns has a height substantially identical to the depth of a corresponding concave pattern among the concave patterns.

3. The display apparatus of claim 1, wherein each of the hard coating patterns fills a space defined by a corresponding concave pattern among the concave patterns.

4. The display apparatus of claim 3, wherein the flexible base layer and the hard coating patterns define an upper surface of the window member, the upper surface being a substantially flat plane.

5. The display apparatus of claim 4, wherein:
the upper surface is divided into a first area in which the window member is bent or spread, and a second area that is adjacent to the first area; and
the proportion of the hard coating patterns in the first area is smaller than the proportion of the hard coating patterns in the second area when viewed in a plane.

6. The display apparatus of claim 1, wherein:
the display module is bent or spread about a bending axis extending in one direction; and
the plurality of hard coating patterns are extended in a direction parallel to the bending axis.

7. The display apparatus of claim 1, wherein:
the display module is bent or spread along a first bending axis extending in one direction and is bent or spread along a second bending axis extending in a direction crossing the one direction; and
the plurality of hard coating patterns are arranged in a matrix form by being spaced apart in a direction parallel to the first bending axis and by being spaced apart in a direction parallel to the second bending axis.

8. The display apparatus of claim 1, wherein the difference in refractive index between the flexible base layer and the hard coating patterns is from 0 to about 0.2.

9. The display apparatus of claim 1, wherein:
the hard coating patterns and portions of the flexible base layer between the hard coating patterns define an upper surface of the window member,
the upper surface is divided into a first area in which the window member is bent or spread, and a second area that is adjacent to the first area,
both the first area and the second area comprise the hard coating patterns and the portions of the flexible base layer between the hard coating patterns that define the upper surface,
the plurality of hard coating patterns comprises a first plurality of hard coating patterns in the first area and a second plurality of hard coating patterns in the second area, and
a width of each of the second plurality of hard coating patterns is wider than a width of each of the first plurality of hard coating patterns.

* * * * *